United States Patent [19]
Deville

[11] Patent Number: 5,999,956
[45] Date of Patent: Dec. 7, 1999

[54] SEPARATION SYSTEM FOR NON-STATIONARY SOURCES

[75] Inventor: Yannick Deville, Villecresnes, France

[73] Assignee: U.S. Philips Corporation, New York, N.Y.

[21] Appl. No.: 09/018,979

[22] Filed: Feb. 5, 1998

[30] Foreign Application Priority Data

Feb. 18, 1997 [FR] France .................................. 97 01881

[51] Int. Cl.$^6$ ................................................ G06F 17/10
[52] U.S. Cl. ........................................... 708/322; 708/300
[58] Field of Search .......................... 708/300, 322–323; 375/232–233

[56] References Cited

U.S. PATENT DOCUMENTS

| | | | |
|---|---|---|---|
| 3,696,203 | 10/1972 | Leonard .................................. | 375/232 |
| 5,293,405 | 3/1994 | Gersbach et al. ....................... | 708/323 |
| 5,652,541 | 7/1997 | Yang et al. ............................. | 375/233 |

OTHER PUBLICATIONS

Multi–layer Neural Networks WIth A Local Adaptive Learning Rule Ror Blind Separation of Source Signals, by A. Cichocki, W. Kasprzak, S. Amari, International Symposium on Nonlinear Theory And Its Applications (NOLTA '95) Las Vegas, Dec. 10–14, 1995, 1Ce–5, pp. 61 to 65.

*Primary Examiner*—Tan V. Mai
*Attorney, Agent, or Firm*—Edward W. Goodman

[57] ABSTRACT

A source separation system (10) processes input signals formed by mixtures of primary signals originating from sources and estimates the primary signals so that the estimates do not differ even in the presence of non-stationary input signals. The system includes a first separation sub-assembly (12) which produces first estimates of the primary signals, a second sub-assembly (14) which adaptively determines the separation coefficients, and a third sub-assembly (15) which standardizes the first estimates and produces first standardized estimates used for the calculation of the separation coefficients. An output module (17) produces estimates which have between them the same proportionality ratio as that existing between the primary signals. A selection module (19) avoids an estimate being duplicated on various outputs in the case where certain primary signals are absent or very weak.

8 Claims, 5 Drawing Sheets

SEPARATION SYSTEM FOR NON-STATIONARY SOURCES

BACKGROUND OF THE INVENTION

1. Field of the Invention

The invention relates to a source separation system for processing input signals formed by mixtures of primary signals originating from various sources and for estimating the primary signals, the system comprising a first source separation sub-assembly which, with the aid of separation coefficients, produces estimates of the primary signals, while a second sub-assembly adaptively determining the separation coefficients.

2. Description of the Related Art

There are systems which receive on their inputs signals which present themselves in the form of mixed signals formed by a superpositioning of contributions originating from various signal sources. This is shown, for example, with an antenna that receives signals originating from various transmitters, or when a microphone produces a desired speech signal mixed with undesired disturbing signals. Generally, one wishes to perfectly extract all the source signals which occur in the mixture, either completely or by an optimization of a signal-to-noise ratio.

When using various sensors which produce various mixed signals, one has sought to obtain reliable estimates of the source signals. Known techniques work with unknown mixed signals and unknown source signals, so that the separation techniques are called blind source separation techniques.

Among the known source separation structures, one may cite, for example, the prior art document "Multi-layer neural networks with a local adaptive learning rule for blind separation of source signals", A. CICHOCKI, W. KASPRZAK, S. AMARI, International Symposium on non-linear theory and its applications (NOLTA'95) LAS VEGAS, Dec. 10–14, 1995, 1Ce-5, pages 61 to 65.

This document relates to mixtures which are hard to process, for example, because the mixed signals are very much alike or when the mixed signals have highly different levels.

Nonetheless, the structures described in this document are not suitable when the source signals are non-stationary signals. This forms a considerable drawback, because these types of signals are very often found in the concrete applications such as speech signal processing or, more generally, audio signal processing.

SUMMARY OF THE INVENTION

It is an object of the invention to propose a source separation system which permits of handling the case of non-stationary signals even if these signals enter the category of mixtures that were previously called "hard-to-process" mixtures.

This object is achieved with a source separation system for processing input signals formed by mixtures of primary signals originating from various sources and for estimating the primary signals, the system comprising a first source separation sub-assembly having first inputs connected to the input signals, second inputs for receiving separation coefficients and outputs for producing first estimates of the primary signals, and a second sub-assembly for adaptively determining the separation coefficients, characterized in that the source separation system further comprises a third sub-assembly which receives the first estimates for detecting a maximum estimate with a maximum amplitude level and which standardizes the first estimates relative to the maximum estimate to produce second estimates for application to the second sub-assembly for the calculation of the separation coefficients.

Thus, when the primary signals originating from various sources exhibit considerable amplitude level variations during a transition period, it is impossible that a temporary excessive amplitude level of the second estimates occurs during this transition period. The level of the second estimates always remains inside a given amplitude window.

However, when the level of the input signal is relatively constant, be it either a strong or a weak input signal, the first estimates which are produced on the output exhibit an average level that is substantially the same on the output. This means that the separation coefficients calculated by the system are adapted to maintain the first estimates produced in standardized manner with predefined energy. This may form a handicap in certain applications, because in this manner, the strong or weak nature of an input signal is lost. For example, in the case of speech signals, it may be useful differentiating a weak voice from a strong voice.

For remedying this drawback, according to the invention the third sub-assembly comprises an output module which divides each first estimate by a specific separation coefficient to produce third estimates which are proportional to the primary signals with a proportionality factor that is independent of said primary signals.

In certain particular applications, it may appear that a primary signal is temporarily absent. The situation deserving of attention is that of speakers speaking alternately. Thus, there are moments at which each speaker stops speaking, that is to say, that his source signal is interrupted for a moment to be resumed several instants later. Thus, the estimate of this absent signal is to be zero on the output during these periods. In the case where primary signals are zero or very weak, the separation system will have a tendency of duplicating one of the other non-zero estimates on the unused output. To avoid this situation, according to the invention, the third sub-assembly comprises a selection module which prevents an estimate from being duplicated on a channel assigned to a primary signal that is absent.

These and other aspects of the invention will be apparent from and elucidated with reference to the embodiments described hereinafter.

DESCRIPTION OF THE PREFERRED EMBODIMENTS

Figure 1:
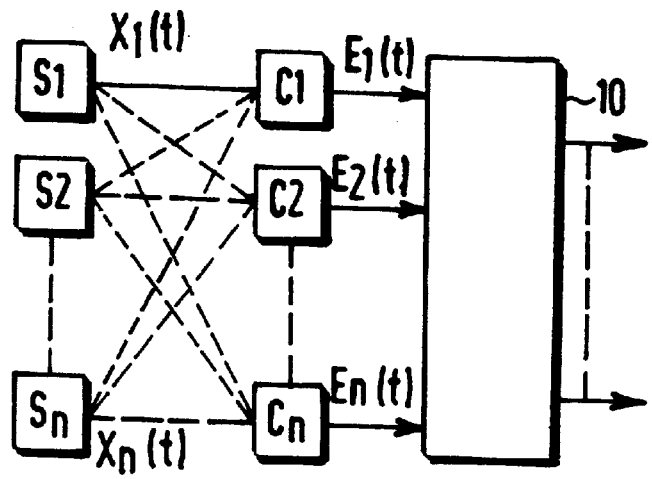
FIG. 1 shows a general circuit diagram of a source separation system.

FIG. 1 represents primary sources S1 to Sn formed, for example, by voices of passengers in a vehicle, by various noise sources (engine, bodywork, air circulation through the windows, etc.) and by a car radio. The primary sources produce primary signals $X_i(t)$. It will be noticed that these primary signals are mixed in the transmission space. For identifing the voices, sensors C1 to Cn, for example, microphones, are placed inside the compartment. The sensors produce mixed signals $E_i(t)$.

Similarly, this may relate to the reception of radio waves transmitted by sources S1 to Sn and detected by sensors formed by antennas C1 to Cn. In the air, the primary signals $X_i(t)$ produced by the transmitters will arrive at the antennas in mixed form. These antennas then supply mixed signals $E_i(t)$ which are the only accessible signals for reception. To obtain estimated signals, called estimates $\hat{X}_i(t)$, where i is a current index varying from 1 to n corresponding to each source based on mixed signals $E_i(t)$, a source separation system 10 is known to be used.

According to the known prior art (FIG. 4), the input signals $E_i(t)$ enter a source separation sub-assembly 12 which produces first estimates $\hat{X}_i(t)$. A second sub-assembly 14 determines separation coefficients $W_{i,j}$ based on the first estimates $\hat{X}_i(t)$. For this purpose, it calculates correction factors $\Delta W_{ij}$ for updating the separation coefficients. These are then inserted into the next cycle in the first sub-assembly 12 for determining subsequent estimates $\hat{X}_i(t)$.

Figure 2:
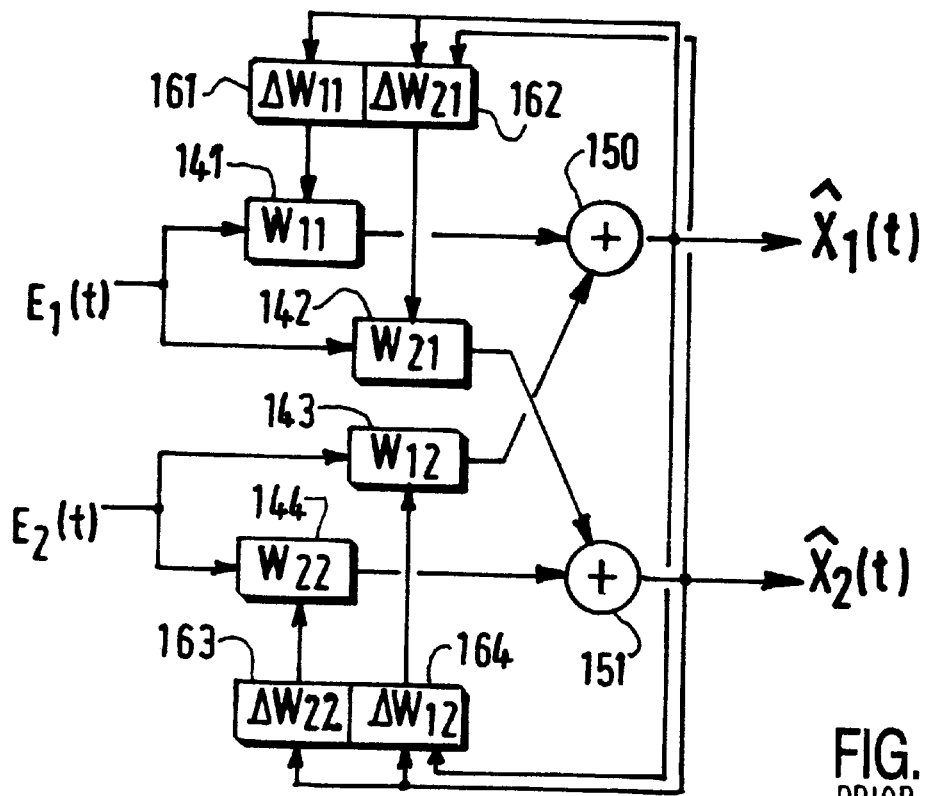
FIG. 2 shows a particular diagram of a prior art separation system for separating two input signals.

For clarity, a simple case of a system will be described having a direct structure comprising a single processing layer for separating two source signals $X_1(t)$ and $X_2(t)$ according to the above-mentioned prior art (FIG. 2). Two sensors produce mixed signals $E_1(t)$ and $E_2(t)$. These signals are linked with the primary signals by the following relations:

$$E_1(t)=a_{11}X_1(t)+a_{12}X_2(t) \quad (1)$$

$$E_2(t)=a_{21}X_1(t)+a_{22}X_2(t) \quad (2)$$

in which the terms $a_{11}$, $a_{12}$, $a_{21}$ and $a_{22}$ are coefficients of unknown mixtures. The signals which occur in these relations are centered signals, that is to say, that the DC components which could occur therein have been eliminated, for example, by a suitable filter operation.

The diagram of the prior art represented in FIG. 2 permits of determining the estimates $\hat{X}_1(t)$ and $\hat{X}_2(t)$ based on mixed signals $E_1(t)$ and $E_2(t)$ based on the relations:

$$\hat{X}_1(t)=W_{11}E_1(t)+W_{12}E_2(t) \quad (3)$$

$$\hat{X}_2(t)=W_{21}E_1(t)+W_{22}E_2(t) \quad (4)$$

in which the terms $W_{11}$, $W_{12}$, $W_{21}$, $W_{22}$ are adaptive separation coefficients.

Figure 4:
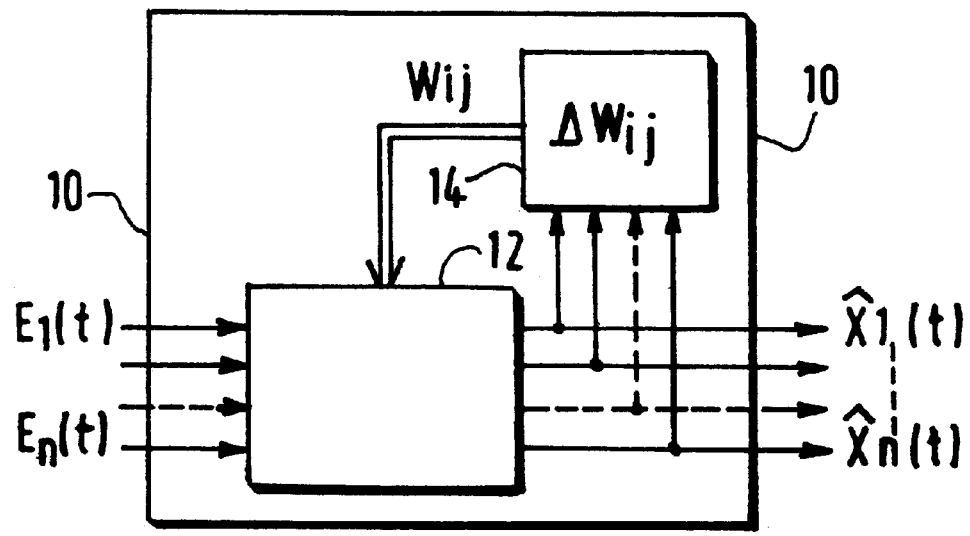
FIG. 4 shows a general circuit diagram of a prior-art source separation system.

For updating the separation coefficients, one may apply the following adaptation rules:

$$W_{ii}(t+1)=W_{ii}(t)-\mu\{f[\hat{X}_i(t)]g[\hat{X}_i(t)]-1\} \quad (5)$$

$$W_{ij}(t+1)=W_{ij}(t)-\mu f\{\hat{X}_i(t)\}g[\hat{X}_j(t)], i \neq j \quad (6)$$

in which $\mu$ is a positive adaptation step while f and g are preferably nonlinear functions. More particularly, one may choose $f(x)=x^3$ and $g(x)=x$. In FIG. 4, the signals $\hat{X}_1(t)$ and $\hat{X}_2(t)$ arrive at the sub-assembly 14 which calculates the correction factors $\Delta W_{ij}$ to be applied to the coefficients $W_{ij}$ between the instants t and t+1 according to the relations:

$$\Delta W_{ii}=W_{ii}(t+1)-W_{ii}(t)=-\mu\{f[\hat{X}_i(t)]g[\hat{X}_i(t)]-1\} \quad (7)$$

$$\Delta W_{ij}=W_{ij}(t+1)-W_{ij}(t)=-\mu f[\hat{X}_i(t)]g[\hat{X}_j(t)], i \neq j \quad (8)$$

The new values of $W_{ij}$ are loaded in separation coefficient memories in the first sub-assembly 12.

The adaptation rule (6) is used for updating the crossed coefficients $W_{12}$ and $W_{21}$, intended to eliminate the component $X_2(t)$ in $\hat{X}_1(t)$ and the component $X_1(t)$ in $\hat{X}_2(t)$.

The adaptation rule (5) is used for updating the direct coefficients $W_{11}$ and $W_{22}$ intended to standardize the shells of the signals $\hat{X}_1(t)$ and $\hat{X}_2(t)$, respectively. These direct coefficients adapt themselves to the nature of the signals to be processed.

In the case of two signals represented in FIG. 2, the mixed signal $E_1(t)$ enters multipliers 141 and 142 and the mixed signal $E_2(t)$ enters multipliers 143, 144. The outputs of the multipliers 141 and 143 are added together in an adder 150, whereas the outputs of the multipliers 142 and 144 are added together in an adder 151 to produce, respectively, the estimates $\hat{X}_1(t)$ and $\hat{X}_2(t)$. The module 161 receives the estimate $\hat{X}_1(t)$ and the module 162 receives the estimates $\hat{X}_1(t)$ and $\hat{X}_2(t)$. The modules 161 and 162 calculate the correction factors $\Delta W_{11}$ and $\Delta W_{21}$ respectively, according to the equations 7 and 8 and produce updated separation coefficients $W_{11}$ and $W_{21}$. A similar processing is carried out in the modules 163 and 164 for the correction factors $\Delta W_{12}$ and $\Delta W_{22}$.

Let us consider the case of source signals which have a relatively constant scale (or a constant envelope) during a given period, wherein the mixing coefficient $a_{ij}$ is furthermore constant or varying very slowly. In this case, the coefficients $W_{11}$ and $W_{22}$ converge to the relatively constant values ensuring predefined energies for the estimates $\hat{X}_1(t)$ and $\hat{X}_2(t)$. In the case where $f(x)=x^3$ and $g(x)=x$, the predefined energy is expressed by $<\hat{X}^4>$. This predefined value is, for example, equal to 1 in the case of equations 5 and 6. Updating the separation coefficients is carried out at each unit of time t, t+1, t+2 . . .

Figure 3:
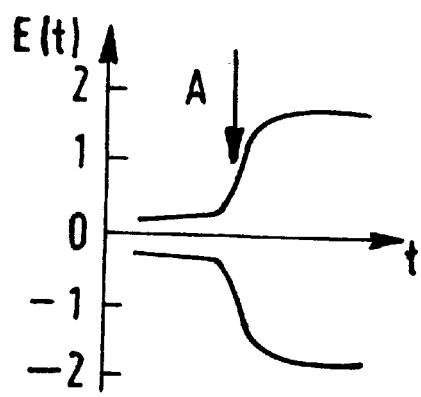
FIG. 3 shows curves of an input signal exhibiting considerable level variations.

When the scale of the source signals suddenly varies considerably, it brings about a rapid and strong variation of the mixed signals. This case is represented in FIG. 3. At point A, there is a sudden variation in the envelope of the mixed signals E(t). Still, at the instants immediately thereafter, according to the previously updated algorithm, the separation coefficients $W_{11}$ and $W_{22}$ will retain values near to those which they had just before this considerable increase, because their adaptation requires a duration which stretches out over several hundred to several thousand time units. Thus, the strong scale increase of the mixed signals also brings about a considerable increase of the estimates $\hat{X}_1(t)$ and $\hat{X}_2(t)$ by the relations (3) and (4) which, in its turn, causes the modifications of the coefficients $W_{11}$ and $W_{22}$ to become considerable because of the relation (5). Thus, the values of these separation coefficients become very high as a result of which a considerable rise of the output signals causes again a rise of the separation coefficients which makes that the outputs may diverge when there are non-stationary signals.

The invention comprises modifying the prior-art system represented in FIG. 4, maintaining the operations (3) and (4), but the modification of the rules to adapt separation coefficients. To be more precise, instead of utilizing the first estimates $\hat{X}_1(t)$ and $\hat{X}_2(t)$ for updating the coefficients, these signals are made to pass through specific means which limit the amplitudes according to the instant under consideration. It is second estimates having limited amplitudes that are used then. Thus, the modifications made in the separation coefficients are limited. In this manner, the new coefficients progressively converge to new stable values and no longer diverge.

Figure 5:
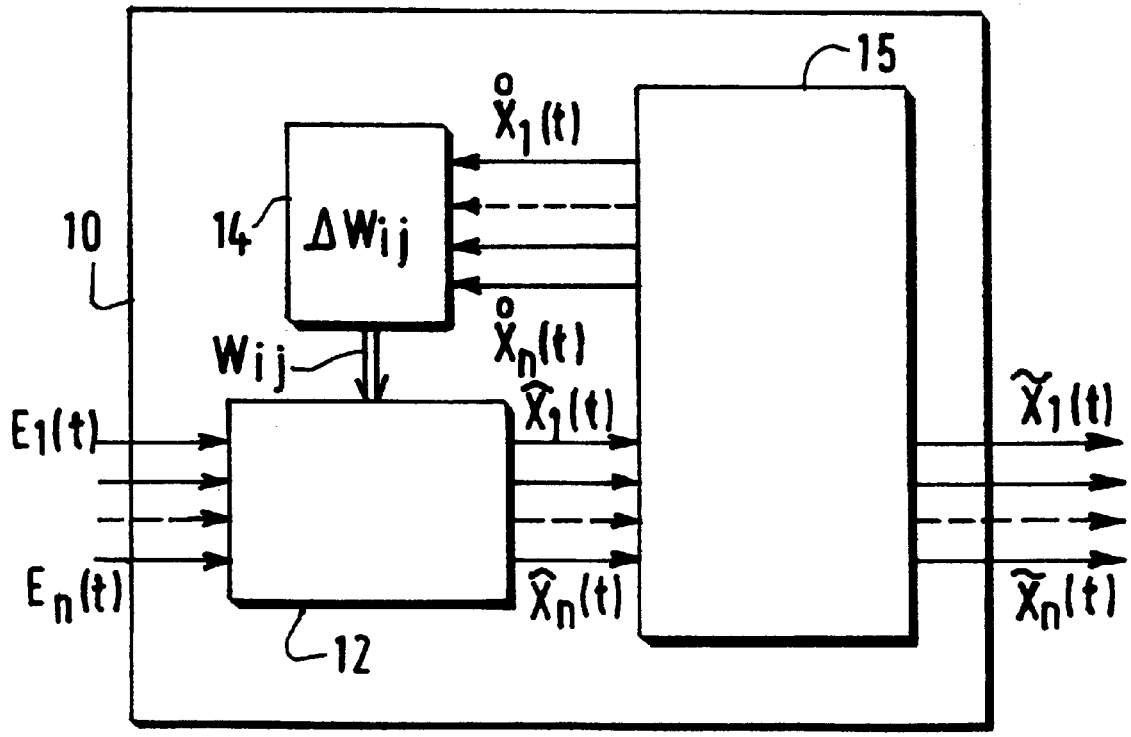
FIG. 5 shows a general circuit diagram of a source separation system according to the invention.
Figure 6:
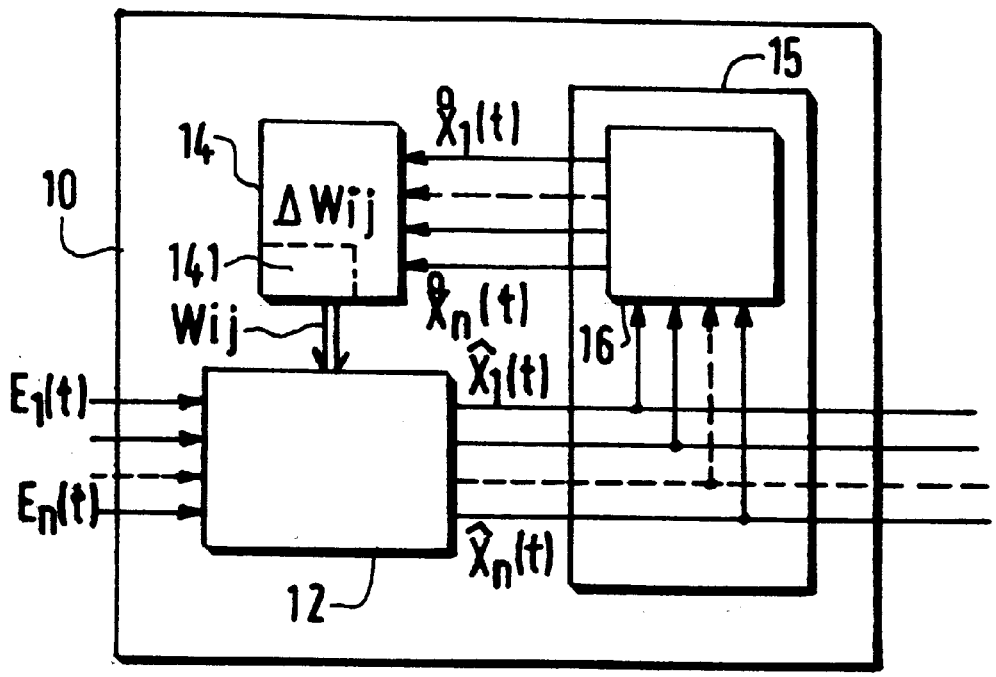
FIG. 6 shows a source separation system according to the invention permitting the estimates not to diverge on the output.

This embodiment is represented in the FIGS. 5 and 6. A third sub-assembly 15 is connected to the output of the first sub-assembly 12. The third sub-assembly transforms the first estimates $\hat{X}_1(t)$ to $\hat{X}_n(t)$ into second estimates $\overset{\circ}{X}_1(t)$ to $\overset{\circ}{X}_n(t)$ whose amplitudes are standardized relative to the maximum amplitude signal, as an absolute value taken from those between $\hat{X}_1(t)$ to $\hat{X}_n(t)$ at the instant under consideration. This operation is realized in an amplitude limiting unit 16 (FIG. 6).

Each instant, the separation coefficients are modified in the following manner:

the outputs $\hat{X}_i(t)$ of the prior-art system are calculated;

the maximum M of their absolute values is calculated which is: $M = \max|\hat{X}_i(t)|, i = 1 \ldots n$;

a threshold value $\beta > 0$ is defined corresponding to the maximum value authorized for the absolute values of the limited signals $\overset{\circ}{X}_i(t)$. This threshold is freely chosen and defines the extent of the desired limitation.

At the instant under consideration, M is compared to $\beta$ and the limitation is realized so that:

if $M \leq \beta$, the signals $\overset{\circ}{X}_i(t)$ have an amplitude that is low enough, thus there is no need to limit, so that:

$$\forall i = 1 \ldots n, \overset{\circ}{X}_i(t) = \hat{X}_i(t);$$

if $M > \beta$, at least one signal having a high amplitude, thus all the signals with the same reduction factor are limited, so that:

$$\forall i = 1 \ldots n, \overset{\circ}{X}_i(t) = \beta \frac{\hat{X}_i(t)}{M}.$$

The variations $\Delta W_{ij}$ are calculated in the same manner as in the prior-art system. The second sub-assembly 14 determines the modifications to be made to the separation coefficients $W_{ij}$ based on second estimates $\overset{\circ}{X}_1(t)$ to $\overset{\circ}{X}_n(t)$, that is to say:

$$\Delta W_{ii} = -\mu \{f[\overset{\circ}{X}_i(t)]g[\overset{\circ}{X}_i(t)] - 1\} \qquad (9)$$

$$\Delta W_{ij} = -\mu f[\overset{\circ}{X}_i(t)]g[\overset{\circ}{X}_j(t)], \; i \neq j. \qquad (10)$$

The invention may also be applied (module 12) to a source separation structure described in the document: "Blind separation of sources, Part I: An adaptive algorithm based on neuromimetic architecture" C. Jutten, J. Hérault, Signal Processing, 24, 1991, pages 1–10.

A second possibility which permits limiting the divergence of the output signals consists of calculating the correction factors:

$$F_{ii}(t) = -\mu \{f[\hat{X}_i(t)]g[\hat{X}_i(t)] - 1\}, \; i = j \qquad (11)$$

$$F_{ij}(t) = -\mu f[\hat{X}_i(t)]g[\hat{X}_j(t)], \; i \neq j \qquad (12)$$

but instead of utilizing these correction factors just as they are used for updating the separation coefficients, the signals corresponding to these correction factors are made to pass through low-pass filter means to reduce the development of these variations. This avoids sudden scale changes. This solution is found to be less robust than the preceding one. Preferably, this solution is associated with the first solution and, in this case, the second sub-assembly 14 comprises a low-pass filter unit 141 which filters the correction factors $F_{ij}(t)$ to calculate the variations of coefficients $\Delta W_{ij}$ to update the separation coefficients $W_{ij}$.

In this case, each separation coefficient is modified by a quantity $\Delta W_{ij}(t)$ which results from a first-order low-pass filtering, that is to say:

$$\Delta W_{ij}(t) = \frac{F_{ij}(t) + \alpha \Delta W_{ij}(t-1)}{1 + \alpha}$$

Which can also be expressed by:

$$W_{ij}(t+1) = W_{ij}(t) + \frac{F_{ij}(t+1) + \alpha(W_{ij}(t) - W_{ij}(t-1))}{1 + \alpha}$$

where $\alpha > 0$ is a parameter of the filter defining the amplitude of the smoothing effect caused by the filter. This parameter is predetermined.

The result of the energy standardization operation carried out with the first estimates produced by the first sub-assembly is that these neighboring estimates having predefined energy are maintained, and this whatever the scale of the signal sources. The first estimates will thus converge to the same standardized energy. This is not always acceptable in all the applications where non-stationary source signals appear. For example, let us consider the case where the source signals are speech signals with periods in which the signals have much energy (loud words) and periods in which the signals have little energy (soft words). In the situation described previously, the first estimates would all have the same high energy level in these two situations which narrows down to leveling the energy.

Figure 7:
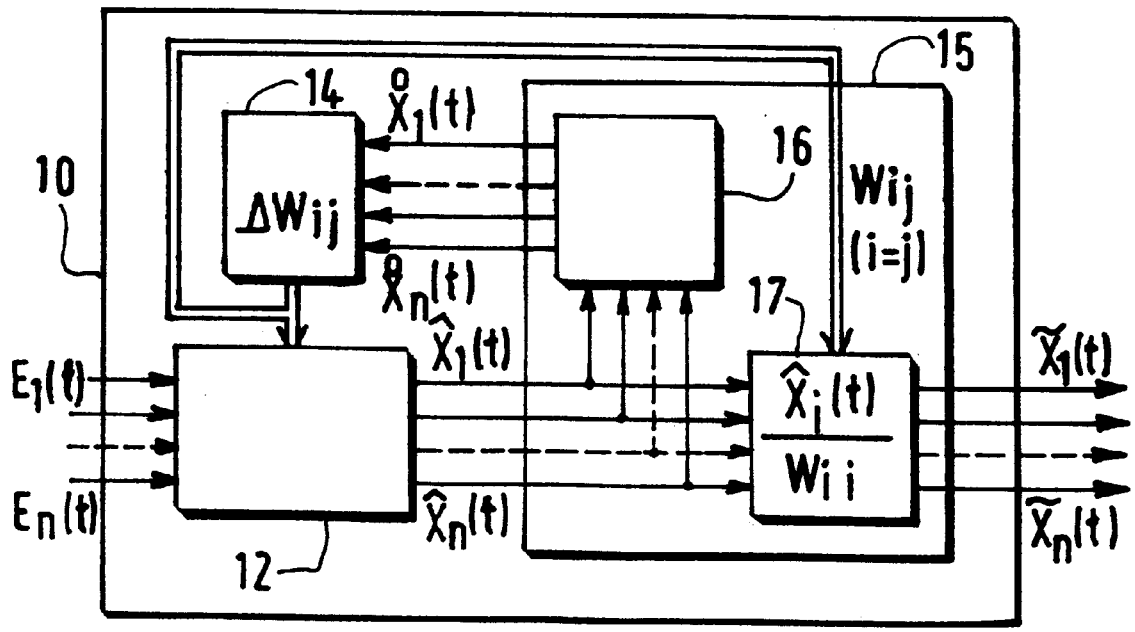
FIG. 7 shows a diagram of source separation according to the invention permitting the estimates not to diverge and to remain proportioned to the input signals.

To remedy this effect, according to the invention (FIG. 7) an after treatment is given to the first estimates $\hat{X}_i(t)$. Therefore, each first estimate $\hat{X}_i(t)$ of rank i is divided by the separation coefficient $W_{ii}$ corresponding to its rank, appearing in the equations 3 and 4. This has something in common with a destandardization or with an auto-adaptive gain control. It will easily be noticed that the three estimates $\tilde{X}_i(t) = \hat{X}_i(t)/W_{ii}$ thus obtained are proportional to the source signals which correspond to $X_i(t)$ with a constant proportionality factor. This operation is carried out in the output module 17 represented in FIG. 7.

Thus, the processing steps first consist of multiplying the mixed signals by the separation coefficients $W_{ij}$, then producing the first standardized estimates $\hat{X}_i(t)$ and after that dividing them by the same separation coefficients $W_{ii}$ to obtain third destandardized estimates $\tilde{X}_i(t) = \hat{X}_i(t)/W_{ii}$. It should be observed that these operations are not redundant and do not cancel each other.

Another particular embodiment of the invention relates to the case of two non-stationary signals for which there is only one non-zero source signal $X_i(t)$ during a given period, or, more particularly, to the case of two source signals where one of these signals is very strong compared with the other. In that case, this strong source signal will give rise to an estimate (first or second, as the case may be) which will appear on the two output channels of the device according to the previous embodiments, that is to say, if the signal $X_1(t)$ is strong, then the other signal $X_2(t)$ will be stronger in its turn, the estimate $\hat{X}_1(t)$ will not only appear on channel 1 (assigned to the signal $X_1(t)$), but also on the channel 2. And, vice versa when the signal $X_2(t)$ becomes strong.

For handling this case, the third sub-assembly 15 has at the output a selection module 19 which prevents an estimate from being duplicated on a channel assigned to an absent source signal. The selection module 19 is connected to the output of the output module 17 (FIG. 7) so as to obtain the diagram represented in FIG. 8. This module 19 operates in the following manner:

- if the two signals arriving at its inputs are correlated, then the module 19 produces the signal that has the higher amplitude and keeps the other output at zero;
- if the two signals are not correlated, the processing is carried out independently of the block as has been described previously.

For implementing the function of this module 19, one may be facing:

- a sub-block which detects the proportionality of the two input signals of this module 19 based, for example, on a correlation test which activates the correct multiplexing of the signals arriving there;
- or a source separation module similar to that used for the separation of sources provided in the description or similar to that described in the document by C. Jutten and J. Hérault cited previously. But in that case, the signals which are to be processed are no "hard to process" mixed signals, because at this level they are signals which are either correlated or not.

The case with two signals is given by way of example, while the selection may be effected between more than two signals.

Figure 8:
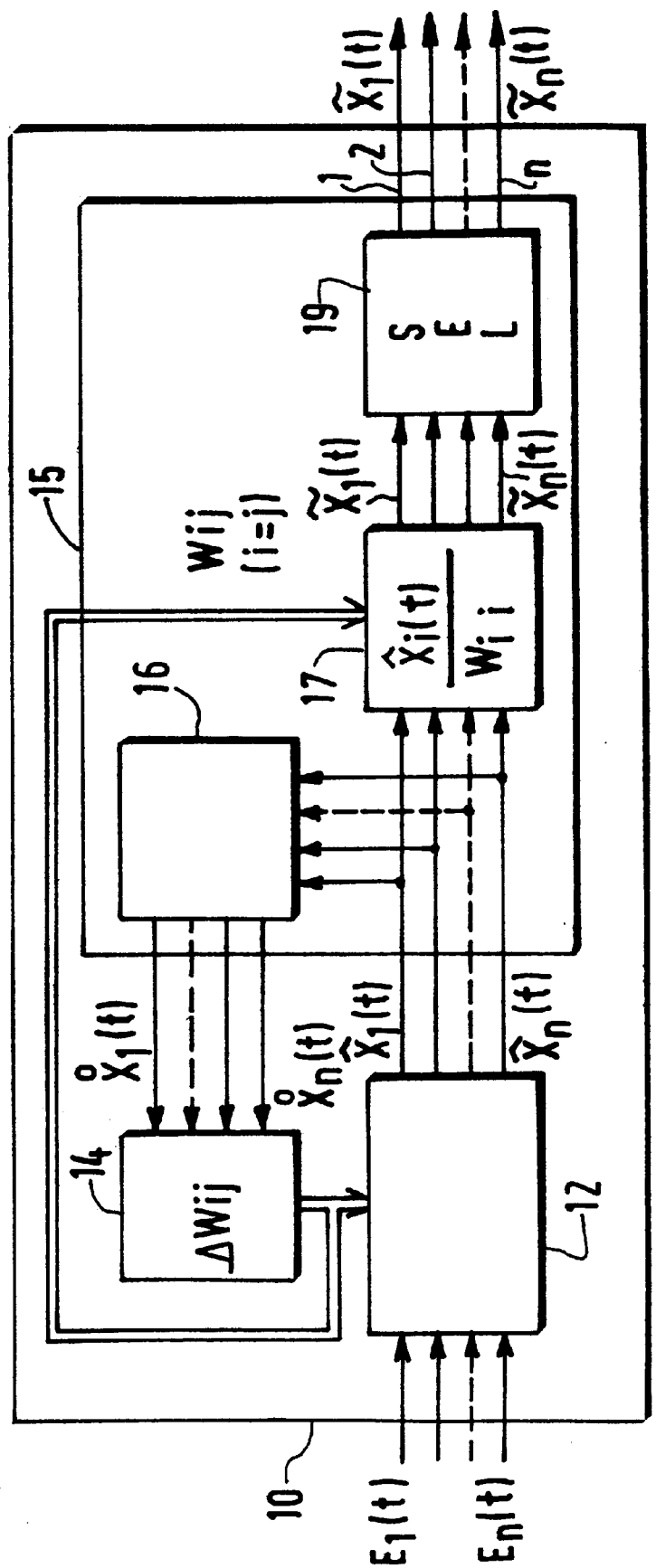
FIG. 8 shows a diagram of a source separation system according to the invention permitting estimates not to diverge, to remain proportioned to the input signals and preventing an estimate being duplicated on a channel assigned to a primary signal that is absent.
Figure 9:
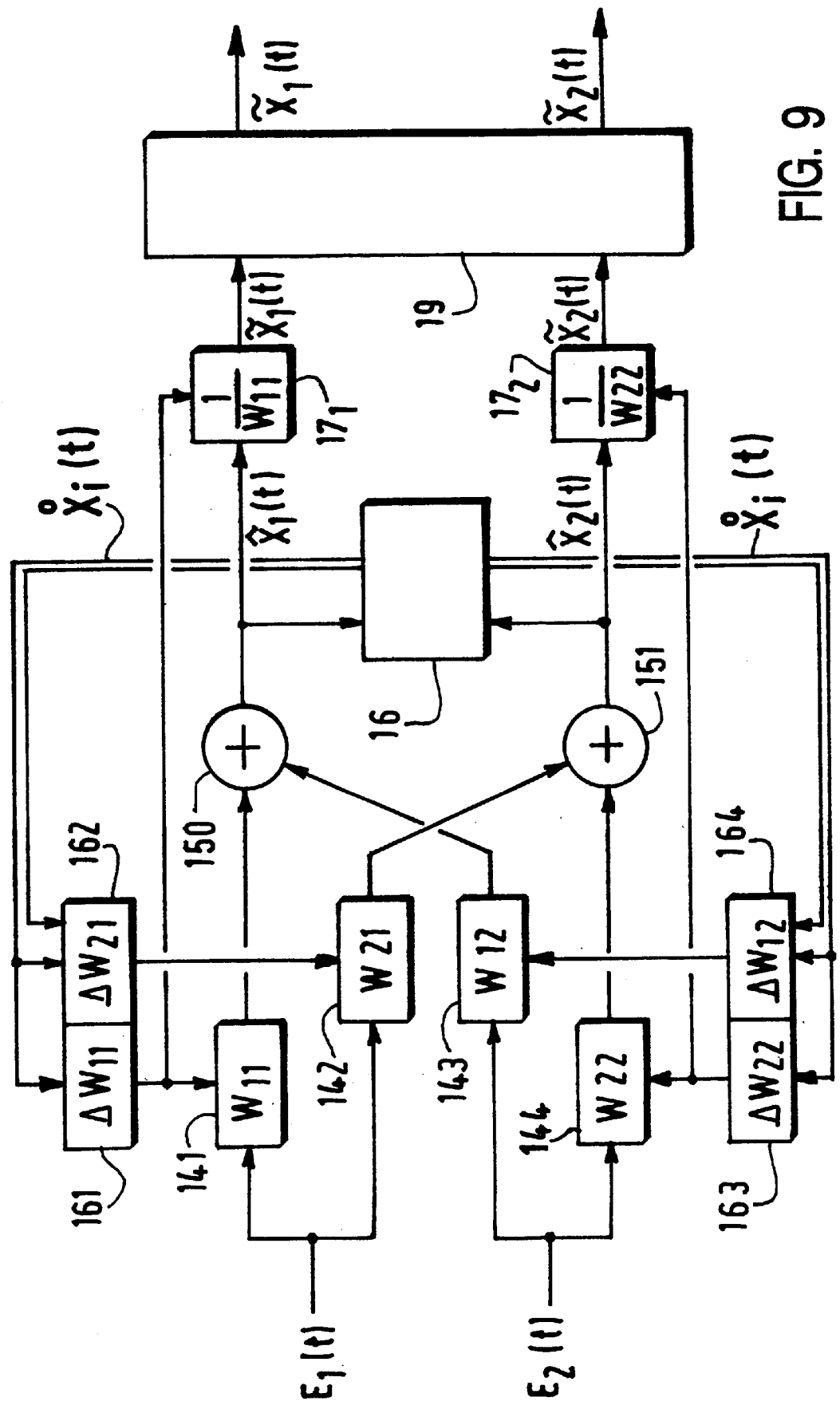
FIG. 9 shows a diagram of a particular example of a source separation system with two input signals in the case of FIG. 8.

FIG. 9 represents a particular embodiment of FIG. 8 in the case where there are only two mixed signals $E_1(t)$ and $E_2(t)$. The same references are used for FIG. 9 and for FIG. 2. The unit 16 for limiting the amplitude applies limited estimates $\mathring{X}_1(t)$ and $\mathring{X}_2(t)$ to the modules 161 to 164 which calculate the new separation coefficients. The output sub-units $17_1$ and $17_2$ calculate $\tilde{X}_1(t)=\hat{X}_1(t)/W_{11}$ and $\tilde{X}_2(t)=\hat{X}_2(t)/W_{22}$, respectively.

When one of the signals $E_1(t)$ or $E_2(t)$ is momentarily absent or very weak, the selection unit 19 provides that the estimate of one signal is not simultaneously duplicated on the channel not assigned to this signal.

I claim:

1. A source separation system for processing input signals formed by mixtures of primary signals originating from various sources and for estimating the primary signals, the system comprising:

a first source separation sub-assembly which has first inputs for receiving the input signals, second inputs for receiving separation coefficients ($W_{ij}$), and outputs for producing first estimates ($\hat{X}_i(t)$) of the primary signals; and a second sub-assembly for adaptively determining the separation coefficients, characterized in that the source separation system further comprises;

a third sub-assembly which receives the first estimates for detecting a maximum estimate with a maximum amplitude level, and which standardizes the first estimates relative to the maximum estimate to produce second estimates ($\mathring{X}(t)$), said third sub-assembly applying said second estimates to the second sub-assembly for the calculation of the separation coefficients.

2. The system as claimed in claim 1, characterized in that the third sub-assembly comprises an output module for dividing each first estimate ($\hat{X}_i(t)$) by a specific separation coefficient ($W_{ii}$) to produce third estimates ($\tilde{X}_i(t)$), said third estimates being proportional to the primary signals with proportionality factors which are independent of said primary signals ($X_i(t)$).

3. A system as claimed in claim 2, characterized in that the third sub-assembly has output channels assigned specifically to each estimate, the third sub-assembly comprising a selection module for preventing an estimate from being duplicated on a channel assigned to a primary signal that is absent.

4. A system as claimed in claim 3, characterized in that the second sub-assembly comprises filter means for filtering the separation coefficients.

5. A system as claimed in claim 2, characterized in that the second sub-assembly comprises filter means for filtering the separation coefficients.

6. A system as claimed in claim 1, characterized in that the third sub-assembly has output channels assigned specifically to each estimate, the third sub-assembly comprising a selection module which for preventing an estimate from being duplicated on a channel assigned to a primary signal that is absent.

7. A system as claimed in claim 3, characterized in that the second sub-assembly comprises filter means for filtering the separation coefficients.

8. A system as claimed in claim 1, characterized in that the second sub-assembly comprises filter means for filtering the separation coefficients.

* * * * *